US010825618B2

(12) United States Patent
Hsu

(10) Patent No.: US 10,825,618 B2
(45) Date of Patent: Nov. 3, 2020

(54) POWER SWITCH MODULE

(71) Applicant: Cheng-Tsuen Hsu, Taipei (TW)

(72) Inventor: Cheng-Tsuen Hsu, Taipei (TW)

( * ) Notice: Subject to any disclaimer, the term of this patent is extended or adjusted under 35 U.S.C. 154(b) by 400 days.

(21) Appl. No.: 15/955,649

(22) Filed: Apr. 17, 2018

(65) Prior Publication Data

US 2018/0301296 A1 Oct. 18, 2018

Related U.S. Application Data

(60) Provisional application No. 62/486,953, filed on Apr. 18, 2017.

(30) Foreign Application Priority Data

Jun. 30, 2017 (TW) .............................. 106122108 A

(51) Int. Cl.
| | | |
|---|---|---|
| *H01H 9/54* | (2006.01) | |
| *H01H 33/04* | (2006.01) | |
| *H01L 27/07* | (2006.01) | |
| *H03K 17/082* | (2006.01) | |
| *H03K 17/16* | (2006.01) | |
| *H01H 47/32* | (2006.01) | |

(Continued)

(52) U.S. Cl.
CPC ............ *H01H 9/542* (2013.01); *H01H 33/04* (2013.01); *H01H 47/32* (2013.01); *H01L 27/0766* (2013.01); *H03K 17/0822* (2013.01); *H03K 17/16* (2013.01); *H01H 9/30* (2013.01); *H01H 47/22* (2013.01); *H01H 50/002* (2013.01); *H01H 2009/544* (2013.01)

(58) Field of Classification Search
CPC ............ H01H 9/30; H01H 9/54; H01H 9/541; H01H 9/542; H01H 2009/544; H01H 33/04; H01H 47/22; H01H 47/32; H01H 50/00; H01H 50/002; H01L 27/0766; H03K 17/0822; H03K 17/16
See application file for complete search history.

(56) References Cited

U.S. PATENT DOCUMENTS

| | | | | |
|---|---|---|---|---|
| 5,564,375 A | * | 10/1996 | Orzal ................... | F02N 11/0803 123/179.3 |
| 2013/0039101 A1 | * | 2/2013 | Lu ........................... | H02H 9/001 363/49 |
| 2013/0201594 A1 | * | 8/2013 | Lin ........................ | H01H 47/12 361/191 |

FOREIGN PATENT DOCUMENTS

| | | | | |
|---|---|---|---|---|
| CN | 208173507 | * | 11/2018 | ............. H01H 47/04 |
| CN | 109920697 | * | 3/2019 | ............. H01H 47/08 |
| JP | 2009171779 | * | 7/2009 | ............... H02K 7/00 |

* cited by examiner

*Primary Examiner* — Matthew V Nguyen
(74) *Attorney, Agent, or Firm* — JCIPRNET

(57) ABSTRACT

A power switch module including a switch element, an electromagnetic relay (EMR) and a switching circuit is provided. A first terminal of the switch element is grounded. A control terminal of the switch element receives a driving signal. First control terminals of the switching circuit and the EMR are coupled to a DC power. Second control terminals of the switching circuit and the EMR are coupled to a second terminal of the switch element. Power input terminals of the switching circuit and the EMR are coupled to each other and coupled to an input terminal of the power switch module. Power output terminals of the switching circuit and the EMR are coupled to each other and coupled to an output terminal of the power switch module. The switching circuit is configured to prevent an arc phenomenon caused on the EMR when the EMR is turned on or turned off.

10 Claims, 3 Drawing Sheets

(51) Int. Cl.
*H01H 9/30* (2006.01)
*H01H 47/22* (2006.01)
*H01H 50/00* (2006.01)

POWER SWITCH MODULE

CROSS-REFERENCE TO RELATED APPLICATION

This application claims the priority benefit of U.S. provisional application Ser. No. 62/486,953, filed on Apr. 18, 2017 and a Taiwan application serial no. 106122108, filed on Jun. 30, 2017. The entirety of each of the above-mentioned patent application is hereby incorporated by reference herein and made a part of this specification.

BACKGROUND OF THE INVENTION

Field of the Invention

The invention relates to a power device and particularly relates to a power switch module capable of preventing a relay from producing an arc.

Description of Related Art

In modern life, the use of electrical appliances has become quite popular, and people's demand for electrical appliances is also increasing. Many homes or offices purchase power extension lines in order to increase the use of the electrical appliances, and some people will choose smart power extension lines for the needs of power saving and power safety. The smart power extension line generally has a switch module. The switch module may be automatically turned off or may be controlled to implement turn-on/off switching in case of overuse of electricity or when a load is too large.

In terms of current technology, the switch module is basically composed of a relay, where an electromagnetic relay (EMR) is the most popular. The EMR is generally composed of an iron core, a coil, an armature, and a contact electrode, etc. Generally, as long as a voltage is applied to both ends of the coil, the coil may have a current circulation to produce an electromagnetic force. Then, the armature may overcome a pulling force of a spring and is attracted by the ion core under the function of the electromagnetic force, such that a mobile contact electrode and a static contact electrode are attracted to close. On the other hand, when the coil is power off, the electromagnetic force generated by the electromagnetic effect is accordingly disappeared, and the armature is released to an original position under a reaction force of the spring, and the aforementioned mobile contact electrode and the static contact electrode are separated. Through the aforementioned operations of attraction to close and release, an effect of turning on/off the switch module is achieved.

However, at the moment of releasing and attracting to close the mobile contact electrode and the static contact electrode of the EMR, a distance between the mobile contact electrode and the static contact electrode is very small to cause a very large back electromotive force (EMF), and an arc is liable to be produced between the mobile contact electrode and the static contact electrode. The arc is a gas discharge phenomenon, i.e. a transient sparks produced when current flows through a certain insulating medium (for example, air). When the two contact electrodes of the EMR produce the sparks, carbon deposition on surfaces of the contact electrodes is occurred, which results in a poor contact between the two contact electrodes to decrease a service life of the switch module.

SUMMARY OF THE INVENTION

The invention is directed to a power switch module, which is adapted to prevent an electromagnetic relay in the power switch module from producing an arc, so as to prolong a service life of the power switch module.

The invention provides a power switch module including a switch element, an electromagnetic relay (EMR) and a switch circuit. A first terminal of the switch element is coupled to a ground power. A control terminal of the switch element receives a driving signal. A first control terminal of the EMR is coupled to a direct current (DC) power. A second control terminal of the EMR is coupled to a second terminal of the switch element. A power input terminal of the EMR is coupled to an input terminal of the power switch module. A power output terminal of the EMR is coupled to an output terminal of the power switch module. The EMR turns on a transmission path between the power input terminal and the power output terminal in response to a turn-on state of the switch element. The switch circuit include a first diode, a second diode, an energy storage element, a controllable current source, an optical coupler and a TRIAC. An anode of the first diode is coupled to the DC power. A cathode of the second diode is coupled to the second terminal of the switch element. The energy storage element is coupled between a cathode of the first diode and an anode of the second diode. A first terminal of the controllable current source is coupled to the anode of the second diode. A control terminal of the controllable current source is coupled to the cathode of the first diode. A first control terminal of the optical coupler is coupled to the cathode of the first diode. A second control terminal of the optical coupler is coupled to a second terminal of the controllable current source. A first load terminal of the optical coupler is coupled to the input terminal of the power switch module. A second load terminal of the optical coupler generates a switch signal. A first terminal of the TRIAC is coupled to the input terminal of the power switch module. A control terminal of the TRIAC receives the switch signal. A second terminal of the TRIAC is coupled to the output terminal of the power switch module.

In an embodiment of the invention, when the switch element is turned on in response to the driving signal, the DC power charges the energy storage element, and the controllable current source generates a current based on the DC power, such that the optical coupler turns on a transmission path between the first load terminal and the second load terminal in response to the current to generate the switch signal, so as to turn on the TRIAC.

In an embodiment of the invention, when the switch element is turned off in response to the driving signal, the controllable current source generates the current based on electric energy stored in the energy storage element to make the energy storage element to discharge, and turns off the transmission path between the first load terminal and the second load terminal after the energy storage element discharges by a first time length, so as to turn off the TRIAC.

In an embodiment of the invention, when the switch element is turned off in response to the driving signal, the EMR turns off the transmission path between the power input terminal and the power output terminal after a second time length, where the first time length is greater than the second time length.

In an embodiment of the invention, the input terminal of the power switch module is configured to receive an alternating current (AC) power, and the TRIAC is turned off when an AC voltage of the AC power is at a zero crossing point.

In an embodiment of the invention, the controllable current source includes a first resistor, a voltage regulation triode, a transistor and a second resistor. A first terminal of the first resistor is coupled to the cathode of the first diode. An anode of the voltage regulation triode is coupled to the anode of the second diode. A cathode of the voltage regulation triode is coupled to a second ten final of the first resistor. A first terminal of the transistor is coupled to the second control terminal of the optical coupler. A control terminal of the transistor is coupled to the second terminal of the first resistor. A second terminal of the transistor is coupled to a reference input terminal of the voltage regulation triode. A first terminal of the second resistor is coupled to the second terminal of the transistor, and a second terminal of the second resistor is coupled to the anode of the second diode.

In an embodiment of the invention, the current is a fixed current, and a magnitude of the current is determined by a reference voltage value of the voltage regulation triode and a resistance of the second resistor.

In an embodiment of the invention, the energy storage element is a capacitor, and the first time length is related to a voltage value of the DC power, a capacitance of the capacitor, a resistance of the second resistor and a reference voltage value of the voltage regulation triode.

In an embodiment of the invention, the switch circuit further includes an abnormal protection element. The abnormal protection element is coupled between the second terminal of the TRIAC and the output terminal of the power switch module, where the abnormal protection element and the TRIAC are connected in parallel with the EMR.

In an embodiment of the invention, each of the first diode and the second diode is a Schottky diode.

Based on the above description, in the power switch module of the invention, the switch circuit is adapted to prevent an arc phenomenon of the EMR produced at the moment when the EMR is turned on or turned off, so as to avoid a poor contact between the contact electrodes caused by carbon deposition on surfaces of the contact electrodes of the EMR, and accordingly prolong a service life of the power switch module.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
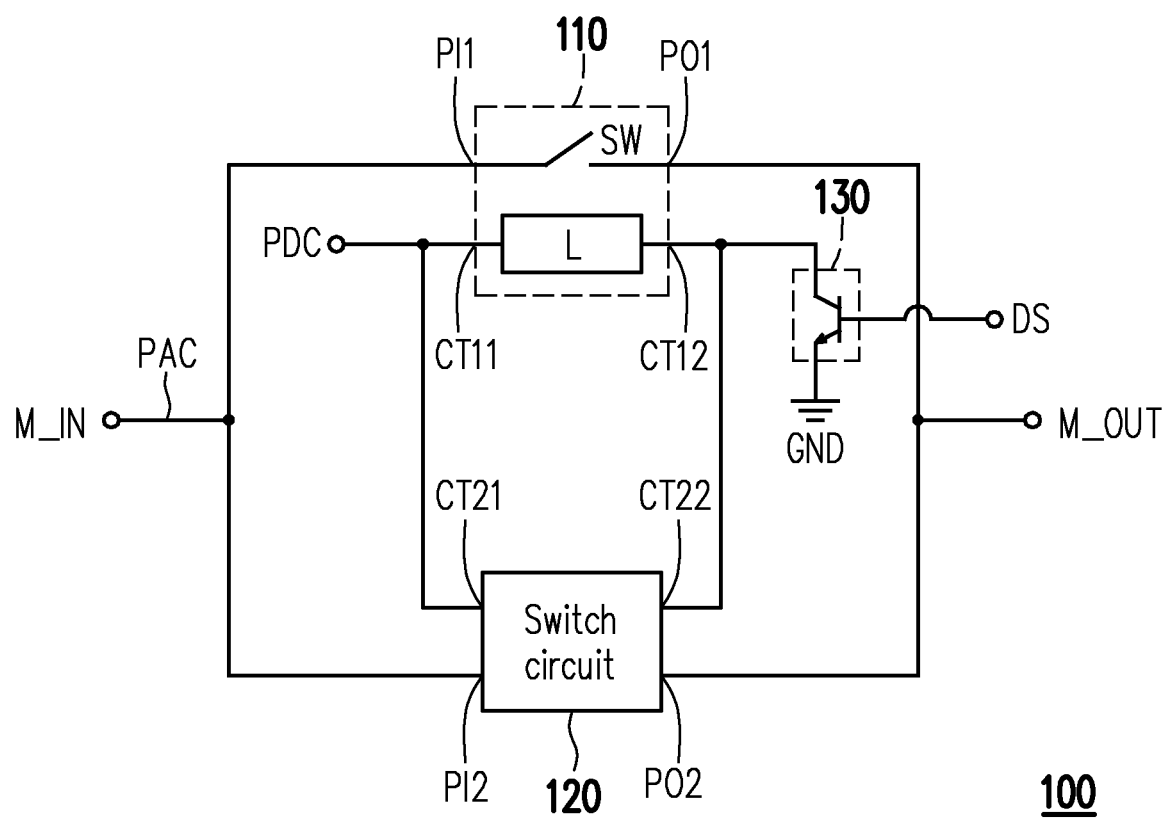
FIG. 1 is a block schematic diagram of a power switch module according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, FIG. 1 is a block schematic diagram of a power switch module 100 according to an embodiment of the invention. The power switch module 100 may include an electromagnetic relay (EMR) 110, a switch circuit 120 and a switch element 130. A first terminal of the switch element 130 is coupled to a ground power GND. A control terminal of the switch element 130 receives a driving signal DS. The switch element 130 may be turned on or off under control of the driving signal DS. In an embodiment of the invention, the switch element 130 may be implemented by a Bipolar Junction Transistor (BJT) or a Metal Oxide Semiconductor Field Effective Transistor (MOSFET), though the invention is not limited thereto. For simplicity's sake, the switch element 130 implemented by a NPN type BJT is taken as an example for description.

The EMR 110 may have a first control terminal CT11, a second control terminal CT12, a power input terminal PI1 and a power output terminal PO1, though the invention is not limited thereto. The first control terminal CT11 of the EMR 110 is coupled to a direct current (DC) power PDC. The second control terminal CT12 of the EMR 110 is coupled to a second terminal of the switch element 130. The power input terminal PI1 of the EMR 110 is coupled to an input terminal M_IN of the power switch module 100 to receive an alternating current (AC) power PAC. The power output terminal PO1 of the EMR 110 is coupled to an output terminal M_OUT of the power switch module 100. The EMR 110 may turn on a transmission path between the power input terminal PI1 and the power output terminal PO1 in response to a turn-on state of the switch element 130. In detail, the EMR 110 may include a coil L and a contact electrode switch SW, where the coil L is coupled between the first control terminal CT11 and the second control terminal CT12, and the contact electrode switch SW is coupled between the power input terminal PI1 and the power output terminal PO1. When the switch element 130 is turned on, the coil L of the EMR 110 produces an electromagnetic effect due to a current circulation, such that the contact electrode switch SW in the EMR 110 is closed to turn on the transmission path between the power input terminal PI1 and the power output terminal PO1, so as to transmit the AC power PAC to the power output terminal PO1.

Similarly, the switch circuit 120 may have a first control terminal CT21, a second control terminal CT22, a power input terminal PI2 and a power output terminal PO2, though the invention is not limited thereto. The first control terminal CT21 of the switch circuit 120 is coupled to the first control terminal CT11 of the EMR 110 and coupled to the DC power PDC. The second control terminal CT22 of the switch circuit 120 is coupled to the second control terminal CT12 of the EMR 110 and coupled to the second terminal of the switch element 130. The power input terminal PI2 of the switch circuit 120 is coupled to the power input terminal PI1 of the EMR 110 and coupled to the input terminal M_IN of the power switch module 100 to receive the AC power PAC. The power output terminal PO2 of the switch circuit 120 is coupled to the power output terminal PO1 of the EMR 110 and coupled to the output terminal M_OUT of the power switch module 100. The switch circuit 120 may turn on a transmission path between the power input terminal PI2 and the power output terminal PO2 in response to the turn-on state of the switch element 130, so as to transmit the AC power PAC to the power output terminal PO2. It should be noted that the power switch module 100 has two power transmission channels, and one is to implement the power transmission through the EMR 110, and another one is to implement the power transmission through the switch circuit 120. Particularly, the switch circuit 120 is adapted to prevent an arc phenomenon of the EMR 110 produced at the moment when the EMR 110 is turned on or turned off, so as to prolong a service life of the power switch module 100.

Figure 2:
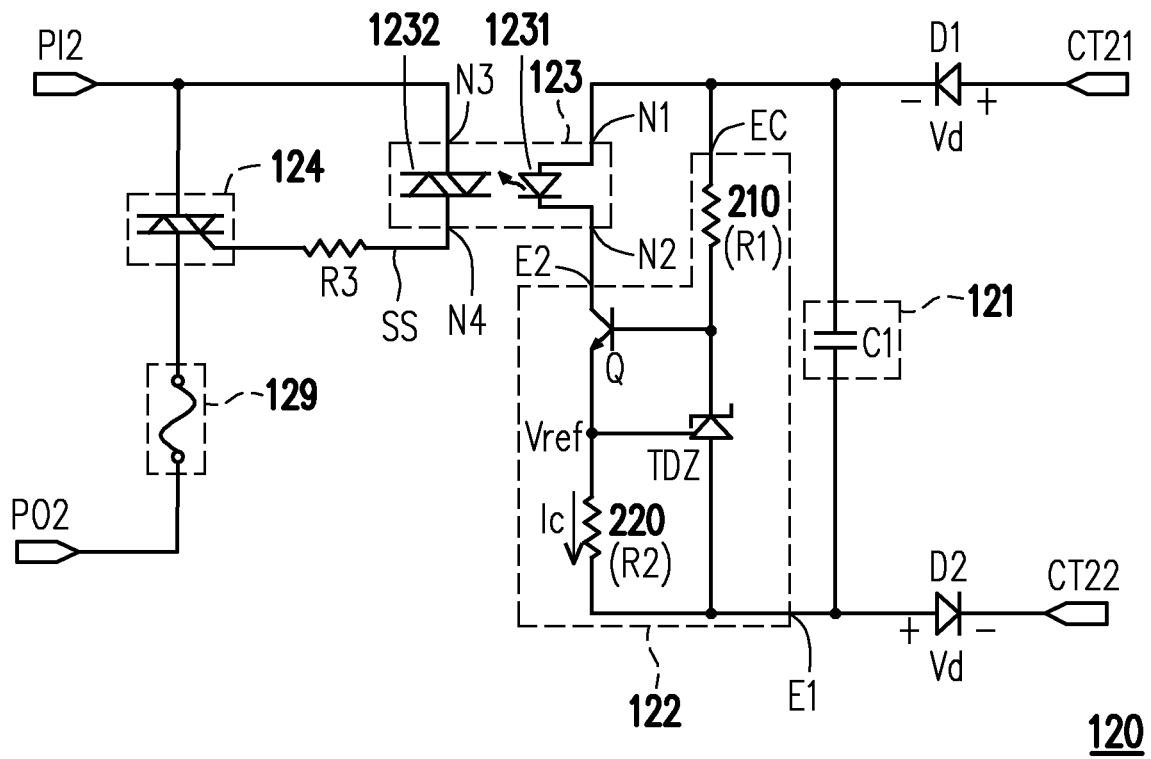
FIG. 2 is a schematic diagram of a circuit framework of a switch circuit according to an embodiment of the invention.

Referring to FIG. 1 and FIG. 2, FIG. 2 is a schematic diagram of a circuit framework of the switch circuit 120 according to an embodiment of the invention. The switch circuit 120 may include a first diode D1, a second diode D2, an energy storage element 121, a controllable current source 122, an optical coupler 123 and a tri-electrode AC switch (TRIAC) 124, though the invention is not limited thereto. An anode of the first diode D1 is coupled to the DC power PDC through the first control terminal CT21. A cathode of the second diode D2 is coupled to the second terminal of the switch element 130 through the second control terminal CT22. The energy storage element 121 is coupled between a cathode of the first diode D1 and an anode of the second diode D2.

A first terminal E1 of the controllable current source 122 is coupled to the anode of the second diode D2. A control terminal EC of the controllable current source 122 is coupled to the cathode of the first diode D1. A first control terminal (an anode control terminal) N1 of the optical coupler 123 is coupled to the cathode of the first diode D1. A second control terminal (a cathode control terminal) N2 of the optical coupler 123 is coupled to a second terminal E2 of the controllable current source 122. A first load terminal N3 of the optical coupler 123 is coupled to the input terminal M_IN of the power switch module 100 through the power input terminal PI2 of the switch circuit 120. A second load terminal N4 of the optical coupler 123 generates a switch signal SS. Generally, the optical coupler 123 includes a light emitter 1231 and a light detection switch 1232. The light emitter 1231 is, for example, a light-emitting diode (LED), and an anode and a cathode of the LED respectively correspond to the first control terminal N1 and the second control terminal N2 of the optical coupler 123. The light detection switch 1232 is, for example, a light transistor, which is adapted to turn on/off a transmission path between the first load terminal N3 and the second load terminal N4 of the optical coupler 123 in response to whether the LED emits light.

A first terminal of the TRIAC 124 is coupled to the input terminal M_IN of the power switch module 100 through the power input terminal PI2 of the switch circuit 120. A control terminal of the TRIAC 124 receives the switch signal SS. A second terminal of the TRIAC 124 is coupled to the output terminal M_OUT of the power switch module 100 through the power output terminal PO2 of the switch circuit 120.

In an embodiment of the invention, the switch circuit 120 may further include a resistor R3 coupled between the second load terminal N4 of the optical coupler 123 and the control terminal of the TRIAC 124. In another embodiment of the invention, the switch circuit 120 may further include an abnormal protection element 129 coupled between the second terminal of the TRIAC 124 and the power output terminal PO2 of the switch circuit 120, where the abnormal protection element 129 is, for example, a fuse, though the invention is not limited thereto. Moreover, according to FIG. 1 and FIG. 2, it is known that the abnormal protection element 129 and the TRIAC 124 are connected in parallel with the EMR 110. Operations of the switch circuit 120 are described in detail below.

Figure 3:
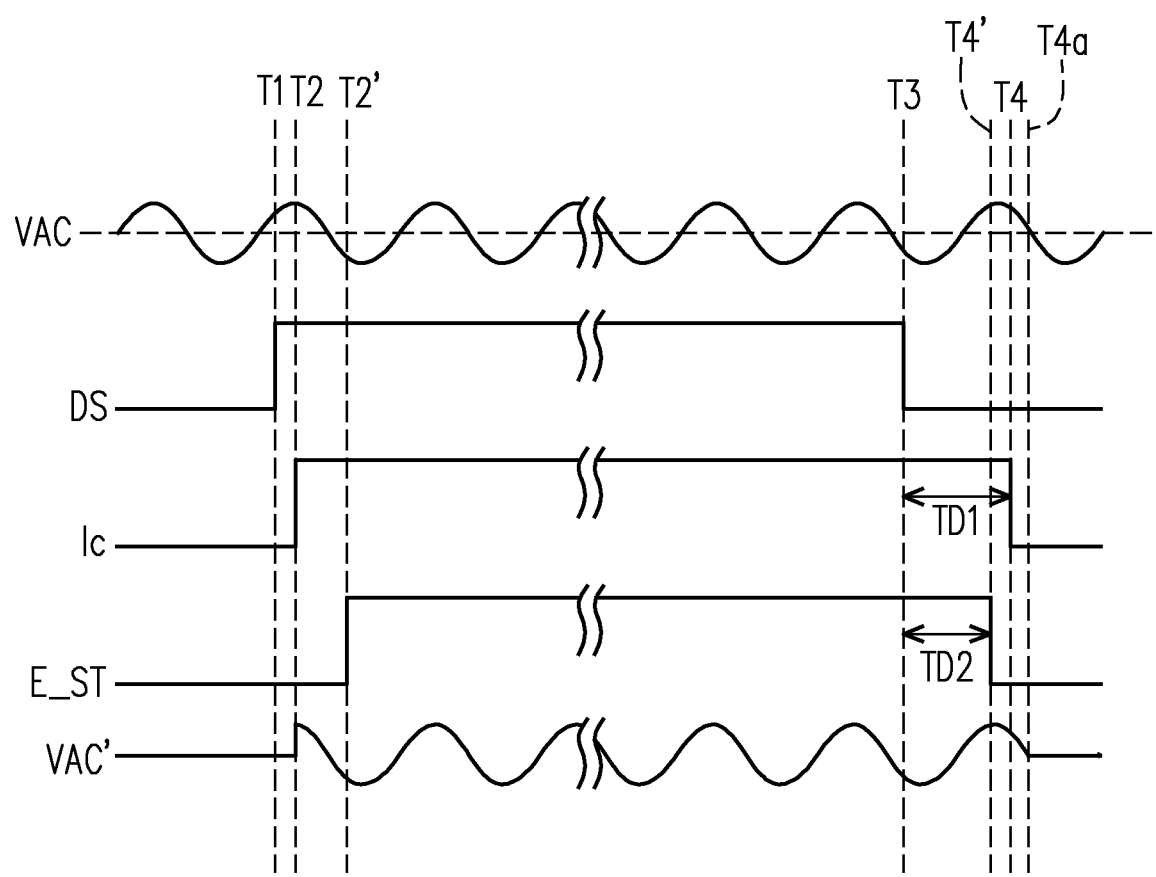
FIG. 3 is a timing diagram of the power switch module of FIG. 1 and the switch circuit of FIG. 2.

Referring to FIG. 1 to FIG. 3, FIG. 3 is a timing diagram of the power switch module 100 of FIG. 1 and the switch circuit 120 of FIG. 2, where a waveform VAC represents an AC voltage waveform of the AC power PAC of the input terminal M_IN, and a waveform VAC' represents an AC voltage waveform of the output terminal M_OUT. Besides, a waveform E_ST represents a state of the contact electrode switch SW of the EMR 110, where a logic low level represents that the contact electrode switch SW is in a non turn-on state, and a logic high level represents that the contact electrode switch SW is in a stable turn-on state.

In a time point T1, the driving signal DS is switched from the logic low level to the logic high level, and the switch element 130 is turned on in response to the logic high level of the driving signal DS. At this point, the first diode D1 and the second diode D2 are forwardly biased and turned on, and the DC power PDC may start charging the energy storage element 121. On the other hand, the controllable current source 122 may generate a current Ic based on the DC power PDC, where the current Ic flows through the light emitter 1231 of the optical coupler 123 to make the light emitter 1231 emits light, such that the light detection switch 1232 in the optical coupler 123 is turned on in response to light emission of the light emitter 1231. In this way, the transmission path between the first load terminal N3 and the second load terminal N4 is turned on to generate the switch signal SS, such that the TRIAC 124 is turned on to transmit the AC power PAC of the input terminal M_IN to the output terminal M_OUT, as shown by a time point T2.

On the other hand, when the switch element 130 is turned on at the time point T1 in response to the driving signal DS, the EMR 110 could enter a bouncing state and completing conduction only after waiting for a Relay ON-delay time. Namely, during the Relay ON-delay time, the EMR 110 stays in the activated state, and enters the bouncing state after the Relay ON-delay time is ended. Only after a Relay ON Contact Bouncing time is ended, the EMR 110 enters a stable turn-on state. In other words, only after the Relay ON Contact Bouncing time of the EMR 110 is ended, the contact electrode switch SW is in the stable turn-on state, as shown by a time point T2', and the waveform E_ST represents that the contact electrode switch SW is in the stable turn-on state. Time lengths of the aforementioned Relay ON-delay time and the Relay ON Contact Bouncing time may be different when different EMR is adopted.

Generally, the optical coupler 123 and the TRIAC 124 has a characteristic of a fast response speed, so that a turn-on delay time (i.e. a time length between the time point T1 and the time point T2) of the switch circuit 120 is smaller than the Relay ON-delay time of the EMR 110. Therefore, when the EMR 110 enters the bouncing state from the activated state, the transmission path between the input terminal M_IN and the output terminal M_OUT of the power switch module 110 is already in the turn-on state (that is because the TRIAC 124 of the switch circuit 120 has been turned on). In this way, an arc phenomenon produced due to a large potential difference between the power input terminal PI1 and the power output terminal PO1 of the EMR 110 is avoided, so as to prolong a service life of the EMR 110.

Then, at a time point T3, the driving signal DS is switched from the logic high level to the logic low level, and the switch element 130 is turned off in response to the logic low level of the driving signal DS. Then, the contact electrode switch SW of the EMR 110 could be turned off only after waiting for a second time length TD2 (i.e. a Relay OFF-delay time), as shown by a time point T4'. In other words, the EMR 110 does not turn off the transmission path between the power input terminal PI1 and the power output terminal PO1 before the time point T4'. The second time length TD2 (i.e. the Relay OFF-delay time of the EMR) may be different when different EMR is adopted.

On the other hand, when the switch element 130 is turned off in response to the driving signal DS at the time point T3, the first diode D1 and the second diode D2 are inversely biased and turned off, so as to avoid the electric energy stored in the energy storage element 121 to discharge through the coil L in the EMR 110. The controllable current source 122 may generate the current Ic based on the electric energy stored in the energy storage element 121, and the energy storage element 121 discharges through the optical coupler 123 and the controllable current source 122, where the current Ic flows through the light emitter 1231 in the optical coupler 123 to make the light emitter 1231 to emit light, so that the transmission path between the first load terminal N3 and the second load terminal N4 of the optical coupler 123 is still in the turn-on state, and the TRIAC 124 maintains the turn-on state.

After the energy storage element 121 discharges by a first time length TD1, as shown by a time point T4, the controllable current source 122 is disabled (i.e. the current Ic is zero) in response to lack of electricity of the energy storage element 121, and the light emitter 1231 in the optical coupler 123 has no current circulation and does not emit light, so that the transmission path between the first load terminal N3 and the second load terminal N4 of the optical coupler 123 is turned off. Then, as shown by a time point T4a, the TRIAC 124 is turned off when an AC voltage of the AC power PAC is at a zero crossing point.

It should be noted that in order to avoid the arc phenomenon of the EMR 110 produced at the moment when the contact electrode switch SW of the EMR 110 is turned off (due to a large potential difference at the two ends of the contact electrode switch SW), the first time length TD1 is required to be greater than the second time length TD2, such that the TRIAC 124 is turned off after the contact electrode switch SW of the EMR 110 is turned off. Since the contact electrode switch SW of the EMR 110 is turned off at the time point T4' (which is earlier than the time point T4a), and the TRIAC 124 is turned off at the time point T4a, the power switch module 100 stops transmitting the AC power PAC to the output terminal M_OUT after the time point T4a.

Design of the first time length TD1 is described below. As shown in FIG. 2, the controllable current source 122 may include a first resistor 210 (with a resistance of R1), a voltage regulation triode TDZ, a transistor Q and a second resistor 220 (with a resistance of R2). A first terminal of the first resistor 210 is coupled to the cathode of the first diode D1. A cathode of the voltage regulation triode TDZ is coupled to a second terminal of the first resistor 210. An anode of the voltage regulation triode TDZ is coupled to the anode of the second diode D2. A first terminal of the transistor Q is coupled to the second control terminal N2 of the optical coupler 123. A control terminal of the transistor Q is coupled to the second terminal of the first resistor 210. A second terminal of the transistor Q is coupled to a reference input terminal of the voltage regulation triode TDZ. A first terminal of the second resistor 220 is coupled to the second terminal of the transistor Q, and a second terminal of the second resistor 220 is coupled to the anode of the second diode D2.

In an embodiment of the invention, the transistor Q may be implemented by a BJT or a MOSFET, though the invention is not limited thereto. To facilitate description, the transistor Q implemented by a NPN-type BJT is taken as an example for description. In an embodiment of the invention, the voltage regulation triode TDZ may be implemented by a voltage regulation integrated circuit with a referential number of TL431, though the invention is not limited thereto. In an embodiment of the invention, the energy storage element 121 may be implemented by a capacitor (with a capacitance of C1).

When the switch element 130 is turned on, the first diode D1 and the second diode D2 are forwardly biased and turned on, and the DC power PDC charges the energy storage element 121, so that a voltage of the energy storage element 121 is (VCC−2×Vd), where VCC represents a voltage value of the DC power PDC, and Vd represents a forward bias value of the first diode D1 and the second diode D2. Moreover, the transistor Q may be turned on to produce the current Ic. In detail, based on a characteristic of the voltage regulation triode TDZ, a potential of the reference input terminal (i.e. an emitter of the transistor Q) of the voltage regulation triode TDZ is stabilized to an inbuilt reference voltage value Vref of the voltage regulation triode TDZ. Moreover, it is assumed that a voltage drop between a base and the emitter of the transistor Q is negligible, a potential of the base of the transistor Q may be stabilized to the reference voltage value Vref. It should be noted that the current Ic generated by the controllable current source 122 is substantially a fixed current, and under a premise of neglecting the forward bias value Vd of the second diode D2, a magnitude of the current Ic may be determined by the reference voltage value Vref of the voltage regulation triode TDZ and the resistance R2 of the second resistor 220, which is shown as a following equation (1):

$$Ic = Vref \div R2 \qquad \text{equation (1)}$$

When the switch element 130 is turned off, the first diode D1 and the second diode D2 are inversely biased and turned off, and the energy storage element 121 discharges through the optical coupler 123 and the controllable current source 112. Along with continuous discharging of the energy storage element 121, a voltage of the energy storage element 121 is continuously decreased. When the voltage of the energy storage element 121 is decreased to the reference voltage value Vref (i.e. the energy storage element 121 discharges by the first time length TD1), the transistor Q is turned off and stops generating the current Ic.

It should be noted that the first time length TD1 is related to the voltage value VCC of the DC power PDC, the capacitance C1 of the capacitor, the resistance R2 of the second resistor 220 and the reference voltage value Vref of the voltage regulation triode TDZ. Therefore, a designer may adjust the first time length TD1 by changing the voltage value VCC of the DC power PDC, the capacitance C1 of the capacitor or the resistance R2 of the second resistor 220; alternatively, the designer may also adjust the first time length TD1 by selecting the voltage regulation triode TDZ with a different reference voltage value Vref. Moreover, in an embodiment of the invention, each of the first diode D1 and the second diode D2 may be a Schottky diode. Since the forward bias value Vd of the Schottky diode is lower than that of a general diode, the forward bias value Vd of equation (3) may be negligible.

In summary, in the power switch module of the invention, the switch circuit is adapted to prevent an arc phenomenon of the EMR produced at the moment when the EMR is turned on or turned off, so as to avoid a poor contact between the contact electrodes caused by carbon deposition on surfaces of the contact electrodes of the EMR, and accordingly prolong a service life of the power switch module.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A power switch module, comprising:
   a switch element, having a first terminal coupled to a ground power, and a control terminal receiving a driving signal;
   an electromagnetic relay, having a first control terminal coupled to a direct current (DC) power, a second control terminal coupled to a second terminal of the switch element, a power input terminal coupled to an input terminal of the power switch module, and a power output terminal coupled to an output terminal of the power switch module, wherein the electromagnetic relay turns on a transmission path between the power input terminal and the power output terminal in response to a turn-on state of the switch element; and
   a switch circuit, comprising:
      a first diode, having an anode coupled to the DC power;
      a second diode, having a cathode coupled to the second terminal of the switch element;
      an energy storage element, coupled between a cathode of the first diode and an anode of the second diode;
      a controllable current source, having a first terminal coupled to the anode of the second diode, and a control terminal coupled to the cathode of the first diode;
      an optical coupler, having a first control terminal coupled to the cathode of the first diode, a second control terminal coupled to a second terminal of the controllable current source, a first load terminal coupled to the input terminal of the power switch module, and a second load terminal generating a switch signal; and
      a TRIAC, having a first terminal coupled to the input terminal of the power switch module, a control terminal receiving the switch signal, and a second terminal coupled to the output terminal of the power switch module.

2. The power switch module as claimed in claim 1, wherein when the switch element is turned on in response to the driving signal, the DC power charges the energy storage element, and the controllable current source generates a current based on the DC power, such that the optical coupler turns on a transmission path between the first load terminal and the second load terminal in response to the current to generate the switch signal, so as to turn on the TRIAC.

3. The power switch module as claimed in claim 2, wherein when the switch element is turned off in response to the driving signal, the controllable current source generates the current based on electric energy stored in the energy storage element to make the energy storage element to discharge, and turns off the transmission path between the first load terminal and the second load terminal after the energy storage element discharges by a first time length, so as to turn off the TRIAC.

4. The power switch module as claimed in claim 3, wherein when the switch element is turned off in response to the driving signal, the electromagnetic relay turns off the transmission path between the power input terminal and the power output terminal after a second time length, wherein the first time length is greater than the second time length.

5. The power switch module as claimed in claim 3, wherein the input terminal of the power switch module is configured to receive an alternating current (AC) power, and the TRIAC is turned off when an AC voltage of the AC power is at a zero crossing point.

6. The power switch module as claimed in claim 3, wherein the controllable current source comprises:
   a first resistor, having a first terminal coupled to the cathode of the first diode;
   a voltage regulation triode, having an anode coupled to the anode of the second diode, and a cathode coupled to a second terminal of the first resistor;
   a transistor, having a first terminal coupled to the second control terminal of the optical coupler, a control terminal coupled to the second terminal of the first resistor, and a second terminal coupled to a reference input terminal of the voltage regulation triode; and
   a second resistor, having a first terminal coupled to the second terminal of the transistor, and a second terminal coupled to the anode of the second diode.

7. The power switch module as claimed in claim 6, wherein the current is a fixed current, and a magnitude of the current is determined by a reference voltage value of the voltage regulation triode and a resistance of the second resistor.

8. The power switch module as claimed in claim 6, wherein the energy storage element is a capacitor, and the first time length is related to a voltage value of the DC power, a capacitance of the capacitor, a resistance of the second resistor and a reference voltage value of the voltage regulation triode.

9. The power switch module as claimed in claim 1, wherein the switch circuit further comprises:
   an abnormal protection element, coupled between the second terminal of the TRIAC and the output terminal of the power switch module,
   wherein the abnormal protection element and the TRIAC are connected in parallel with the electromagnetic relay.

10. The power switch module as claimed in claim 1, wherein each of the first diode and the second diode is a Schottky diode.

* * * * *